United States Patent
Lee et al.

(10) Patent No.: US 6,974,741 B2
(45) Date of Patent: Dec. 13, 2005

(54) METHOD FOR FORMING SHALLOW TRENCH IN SEMICONDUCTOR DEVICE

(75) Inventors: Hsiu-Chun Lee, Taipei (TW); Tse-Yao Huang, Taipei (TW); Yi-Nan Chen, Taipei (TW)

(73) Assignee: NANYA Technology Corporatiion, Taoyuan (TW)

( * ) Notice: Subject to any disclaimer, the term of this patent is extended or adjusted under 35 U.S.C. 154(b) by 0 days.

(21) Appl. No.: 10/751,503

(22) Filed: Jan. 6, 2004

(65) Prior Publication Data
US 2005/0148152 A1    Jul. 7, 2005

(51) Int. Cl.⁷ ......................................... H01L 21/8238
(52) U.S. Cl. ..................... 438/221; 438/296; 438/424; 438/435
(58) Field of Search ............... 438/221, 296, 438/426, 431, 424, 435

(56) References Cited

U.S. PATENT DOCUMENTS

| | | | |
|---|---|---|---|
| 4,994,406 A | * | 2/1991 | Vasquez et al. ............. 438/426 |
| 6,143,624 A | * | 11/2000 | Kepler et al. .............. 438/433 |

* cited by examiner

*Primary Examiner*—Hsien-Ming Lee
(74) *Attorney, Agent, or Firm*—Bacon & Thomas, PLLC

(57) ABSTRACT

Disclosed is a method for forming a shallow trench. The method of the present invention comprises steps of providing a substrate; forming a plurality of operation layers on the substrate; forming photoresist on the uppermost one of the operation layers to define a position to be etched; etching a portion of the operation layers at said position to form an opening; forming a spacing layer on the sidewall of the opening; and etching a portion of the substrate corresponding to the opening to form a shallow trench. By the etching method of the present invention, a striation phenomenon caused by the common mask etch is avoided.

10 Claims, 4 Drawing Sheets

US 6,974,741 B2

METHOD FOR FORMING SHALLOW TRENCH IN SEMICONDUCTOR DEVICE

BACKGROUND OF THE INVENTION

1. Field of the Invention

The present invention relates to a preliminary process for forming a shallow trench isolation in a semiconductor device, more specifically, to a method for forming a shallow trench, which can avoid the occurrence of the striation phenomenon.

2. Description of the Prior Art

In the process for semiconductor devices such as DRAM, the formation of shallow trenches plays an important role.

As shown in FIG. 1, in the process of forming a shallow trench in a DRAM, an oxide layer 12 is formed on a substrate 10, a nitride layer 14 is formed on the oxide layer 12, and a BSG (borosilicate glass) 16 is formed on the nitride layer 14.

Subsequently, a photoresist layer 18 is formed, as shown in FIG. 2. In accordance with general mask etching process, through exposing, developing and imaging, the photoresist layer 18 defines the position to be etched. At the position defined by the photoresist layer 18, the BSG layer 16, nitride layer 14 and oxide layer 12 are etched to form an opening 20. Then the photoresist layer 18 is removed. However, due to the standing wave phenomenon of the light in the exposing step, the sidewall of the photoresist layer 18 is ribbed such that the sidewall of the etched opening is also ribbed, as shown in FIG. 3. Such a condition is referred to striation phenomenon.

In the structure of FIG. 3, the remaining BSG layer 16, nitride layer 14 and oxide layer 12 are used as a hard mask for the subsequent step of etching the substrate 10 to form a shallow trench. However, since the sidewall of the hard mask is ribbed, the sidewall of the etched shallow trench also presents the striation phenomenon. Accordingly, the profile of the shallow trench is degraded. As shown in FIG. 4, when the shallow trench, which presents striation phenomenon, is filled with dielectric material to form a shallow trench isolation (STI), the critical dimensions of the portions of different depths of the STI are not uniform, causing the isolating effects unstable.

Therefore, there is a need for a solution to overcome the problems stated above. The present invention satisfies such a need.

SUMMARY OF THE INVENTION

An objective of the present invention is to provide an etching method, which can prevent the sidewall of the formed shallow trench from being ribbed, thereby maintaining the stable isolation capability of the formed shallow trench isolation.

In accordance with an aspect of the present invention, an method for forming a shallow trench in a semiconductor device comprises steps of providing a substrate; forming a plurality of operation layers on the substrate; forming a photoresist layer on the uppermost one of the operation layers to define a position to be removed; removing a portion of the operation layers at said position to form an opening; forming a liner layer on the sidewall of the opening; and removing a portion of the substrate corresponding to the opening.

BRIEF DESCRIPTION OF THE DRAWINGS

The following drawings are only for illustrating the mutual relationships between the respective portions and are not drawn according to practical dimensions and ratios. In addition, the like reference numbers indicate the similar elements.

DETAILED DESCRIPTION OF THE PREFERRED EMBODIMENT

An embodiment of the present invention will be described in detail with reference to the accompanying drawings.

Figure 1:
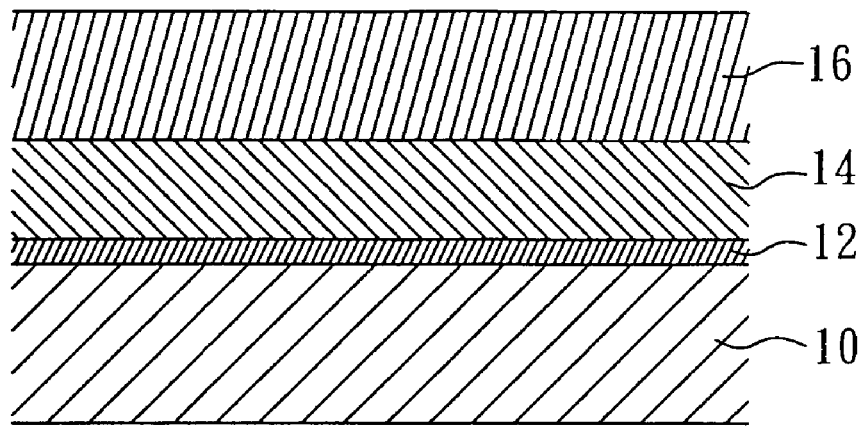
FIG. 1 shows a structure in which the respective operation layers are formed on a semiconductor substrate.
Figure 2:
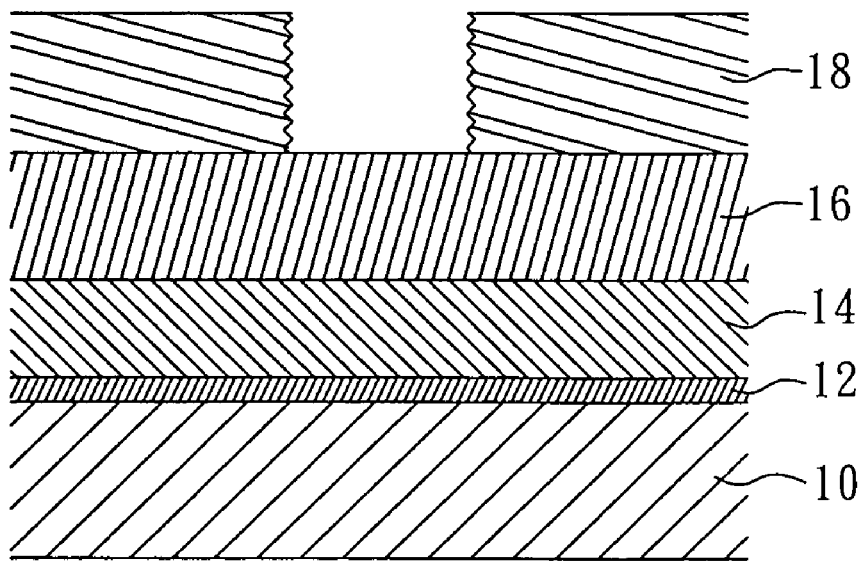
FIG. 2 shows a structure in which a photoresist layer is formed on the structure of FIG. 1.
Figure 3:
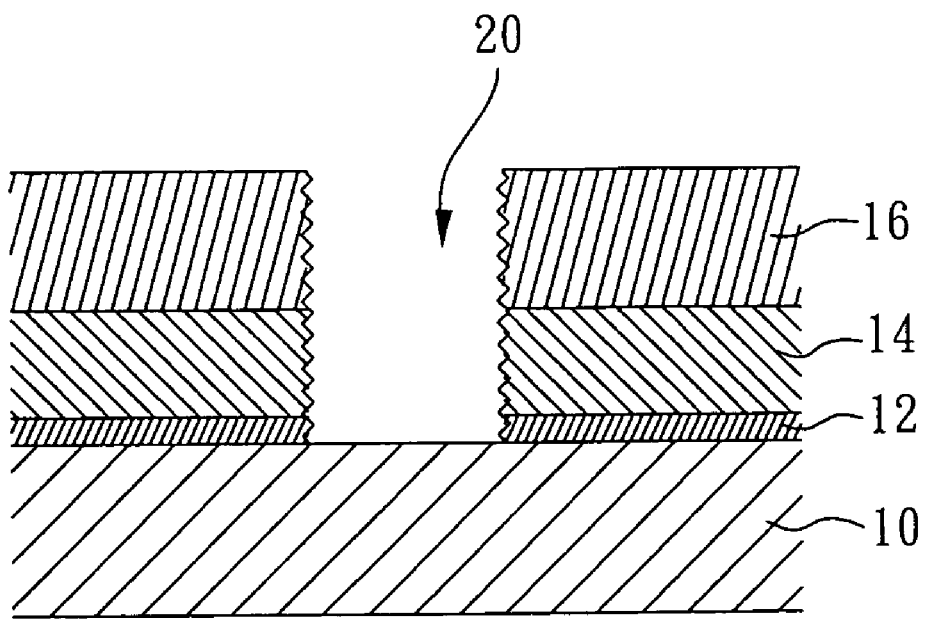
FIG. 3 shows a structure in which the structure of FIG. 2 has an opening formed, and the photoresist layer removed.

With reference to FIG. 1, operation layers such as oxide layer 12, nitride layer 14 and BSG layer 16 are formed on the substrate 10. Then, a photoresist layer 18 is formed to define the position where an opening is to be formed, as shown in FIG. 2. In accordance with general mask etching process, through exposing, developing and imaging, the photoresist layer 18 defines the position to be etched. At the position defined by the photoresist layer 18, the BSG layer 16, nitride layer 14 and oxide layer 12 are etched to form an opening 20. The photoresist layre 18 is then removed. The remaining BSG layer 16, nitride layer 14 and oxide layer 12 are used as a hard mask for the subsequent step of etching the substrate 10 to form a shallow trench. Up to this step, the process is similar to the prior art described above. The sidewall of the opening of the hard mask has the striation phenomenon, as shown in FIG. 3.

Figure 4:
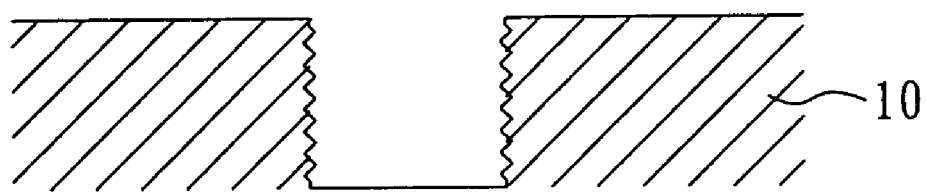
FIG. 4 is a schematic diagram showing a shallow trench formed in accordance with prior art.
Figure 5:
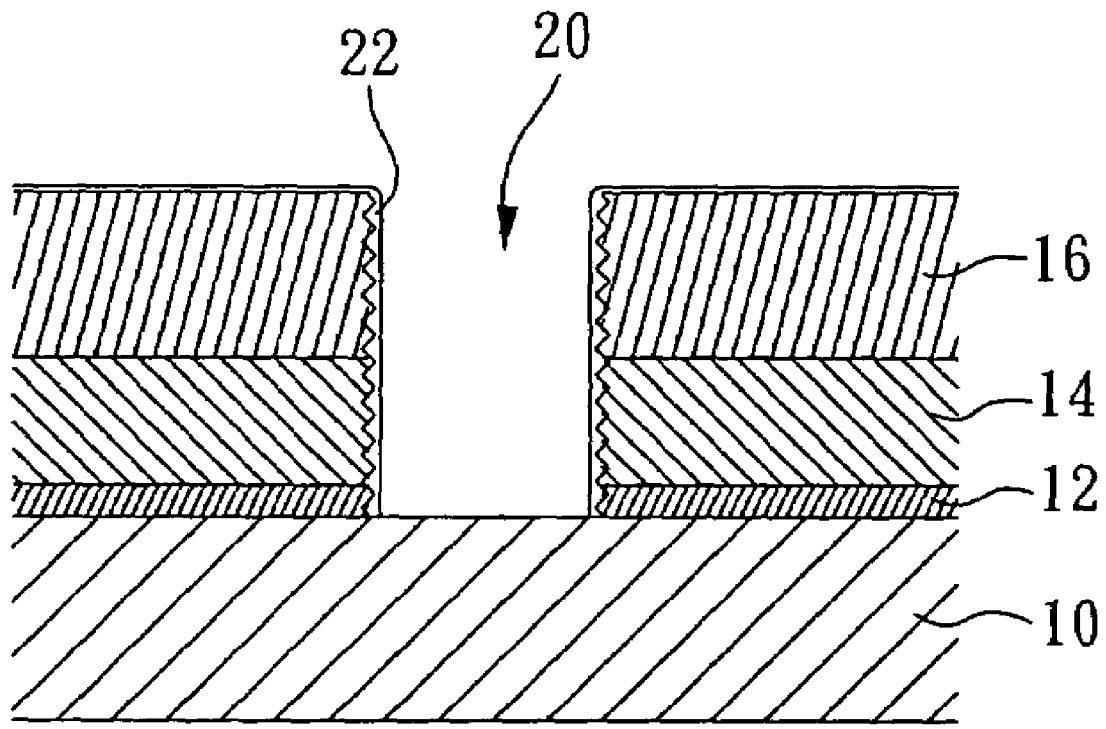
FIG. 5 shows a structure in which the structure of FIG. 3 has a liner layer formed on the sidewall of the opening in accordance with an embodiment of the present invention.

In accordance with an embodiment of the present invention, before forming a shallow trench in the substrate 10, as shown in FIG. 4, a thin liner layer 22 is formed on the sidewall of the opening 20 by any proper manner such as deposition to planarize the sidewall, as shown in FIG. 5. Then the portion of the substrate 10 corresponding to the opening 20 is etched to form a shallow trench. Since the sidewall of the opening is flat, the formed shallow trench has a good profile without striation phenomenon. The material of the liner layer 22 comprises dielectric material, preferably oxide, and more preferably silicon oxide such as TEOS (tetraethyl orthosilicate).

Figure 6:
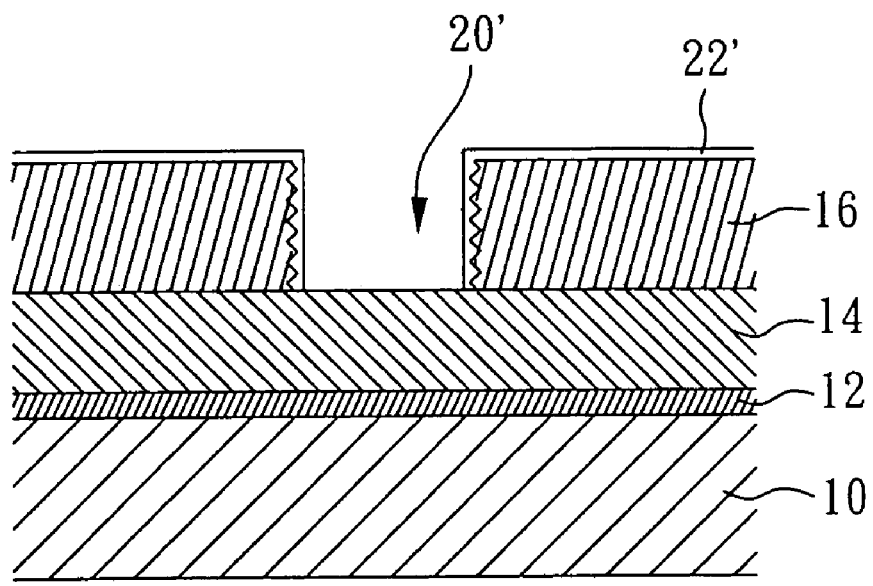
FIGS. 6 and 7 show steps of the method in accordance with another embodiment of the present invention.
Figure 7:
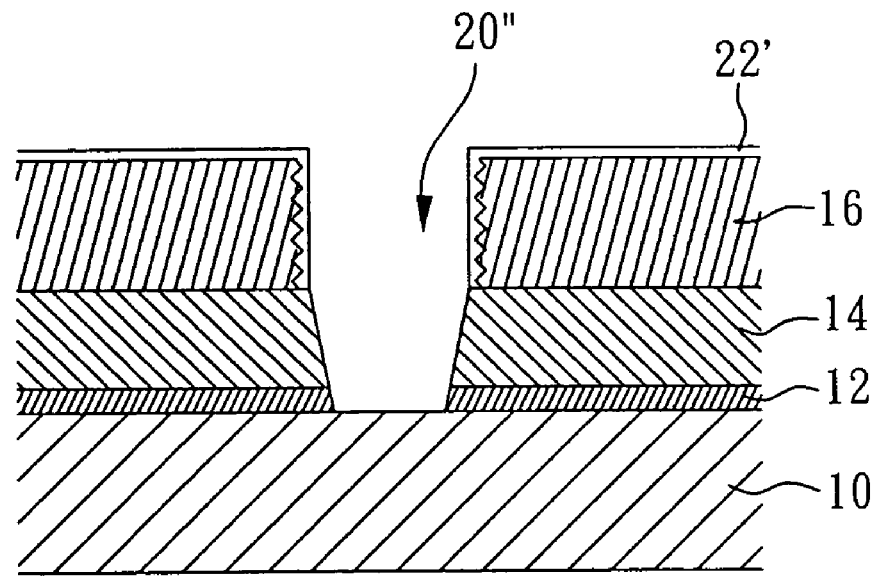

According to another embodiment of the present invention, after the photoresist layer 18 is formed on the BSG layer 16 to define the position to be etched for an opening, as shown in FIG. 2, a portion of the BSG layer 16 is removed by etching to form an opening 20', then a thin liner layer 22' is formed on the sidewall of the opening 20', as shown in FIG. 6. Subsequently, the portions of the nitride layer 14 and oxide layer 12 corresponding to the opening 20' are removed by etching to form an opening 20", as shown in FIG. 7. Then a shallow trench is formed in the substrate 10 as the first embodiment described above. The material of the liner layer 22' can be nitride.

Since the liner layer is very thin, the portion of the liner layer left on the top surface of structure can easily be removed in the subsequent process. No significant influence will occur.

While the embodiments of the present invention is illustrated and described, various modifications and alterations can be made by persons skilled in this art. The embodiment of the present invention is therefore described in an illustrative but not restrictive sense. It is intended that the present invention may not be limited to the particular forms as illustrated, and that all modifications and alterations which maintain the spirit and realm of the present invention are within the scope as defined in the appended claims.

What is claimed is:

1. A method for forming a shallow trench, said method comprising steps of:
    providing a substrate;
    forming a plurality of operation layers on said substrate;
    forming a photoresist layer on the uppermost one of the operation layers to define a position to be removed;
    removing each of the operation layers at said position to form an opening having a sidewall with ripple profile to expose the substrate;
    forming a liner layer on the sidewall of the opening, so that the sidewall of the opening having the liner layer formed thereon has a smooth profile; and
    removing a portion of the exposed substrate to form the shallow trench with smooth profile.

2. The method as claimed in claim 1, wherein the liner layer comprises dielectric material.

3. The method as claimed in claim 2, wherein the liner layer comprises oxide material.

4. The method as claimed in claim 3, wherein the liner layer comprises silicon oxide isolating material.

5. The method as claimed in claim 4, wherein the liner layer comprises TEOS.

6. The method as claimed in claim 1, wherein the liner layer is formed on the sidewall of the opening by deposition.

7. A method for forming a shallow trench, said method comprising steps of:
    providing a substrate;
    forming a plurality of operation layers on said substrate;
    forming a photoresist layer on the uppermost one of the operation layers to define a position to be removed;
    removing the uppermost one of the operation layers at said position to form an opening having a sidewall with ripple profile;
    forming a liner layer on the sidewall of the opening so that the sidewall of the opening having the liner layer formed thereon has smooth profile;
    removing the other ones of the operation layers at the position of the opening to expose the substrate; and
    removing a portion of the exposed substrate to form the shallow trench with smooth profile.

8. The method as claimed in claim 7, wherein the liner layer comprises dielectric material.

9. The method as claimed in claim 8, wherein the liner layer comprises nitride material.

10. The method as claimed in claim 7, wherein the liner layer is formed on the sidewall of the opening by deposition.

* * * * *